(12) United States Patent
Taylor

(10) Patent No.: US 6,961,551 B2
(45) Date of Patent: Nov. 1, 2005

(54) DUAL SPEED SQUELCH CIRCUIT AND METHOD

(75) Inventor: Richard Duane Taylor, Moneta, VA (US)

(73) Assignee: M/A-COM Private Radio Systems, Inc., Lyochburg, VA (US)

(*) Notice: Subject to any disclaimer, the term of this patent is extended or adjusted under 35 U.S.C. 154(b) by 393 days.

(21) Appl. No.: 10/066,141

(22) Filed: Feb. 1, 2002

(65) Prior Publication Data

US 2003/0148746 A1 Aug. 7, 2003

(51) Int. Cl.[7] .............................. H04B 1/10; H04B 1/16
(52) U.S. Cl. ..................... 455/213; 455/219; 455/225
(58) Field of Search ................. 455/212, 213, 455/218, 225; 375/227, 327, 375, 376

(56) References Cited

U.S. PATENT DOCUMENTS

| | | | | |
|---|---|---|---|---|
| 3,750,032 A | * | 7/1973 | Andrews | 455/154.2 |
| 4,132,953 A | * | 1/1979 | Martin, III | 455/218 |
| 4,359,780 A | * | 11/1982 | Day | 455/222 |
| 4,823,296 A | * | 4/1989 | Millar | 708/306 |
| 4,947,456 A | | 8/1990 | Atkinson et al. | |
| 5,199,109 A | * | 3/1993 | Baker | 455/161.2 |
| 5,212,817 A | | 5/1993 | Atkinson | |
| 5,428,826 A | | 6/1995 | Masaki | |
| 5,438,688 A | | 8/1995 | Masaki | |
| 5,450,622 A | * | 9/1995 | Vandegraaf | 455/222 |
| 5,471,660 A | | 11/1995 | Masaki | |
| 5,675,614 A | | 10/1997 | Wetters | |
| 6,055,421 A | * | 4/2000 | Zele et al. | 455/218 |
| 6,101,376 A | | 8/2000 | Bell | |
| 6,192,226 B1 | | 2/2001 | Fang | |
| 6,208,848 B1 | | 3/2001 | Bertrana | |
| 6,259,904 B1 | * | 7/2001 | Branner et al. | 455/212 |
| 6,397,050 B1 | * | 5/2002 | Peterson et al. | 455/221 |
| 6,694,010 B1 | * | 2/2004 | Verreault | 379/386 |

OTHER PUBLICATIONS

NTIA Report 99–358 "Delivered Audio Quality Measurements on Project 25 Land Mobile Radios" by John M. Vanderau dated Nov. 1998.

* cited by examiner

*Primary Examiner*—Sonny Trinh
*Assistant Examiner*—Sam Bhattacharya
(74) *Attorney, Agent, or Firm*—Enrique J. Mora; Beusse, Brownlee, Wolter, Mora & Maire, P.A.

(57) ABSTRACT

Squelch circuit and method useful in frequency-scanned radio receivers are provided. Generally, the squelch circuit includes an audio-removal filter coupled to receive an audio signal. The passband of the audio-removal filter is selected sufficiently high relative to frequency components of the audio signal. An absolute value detector is coupled to the audio-removal filter to supply an output signal having a positive polarity regardless of the polarity of the signal supplied by the audio-removal filter. An integrating filter is coupled to receive the output signal from the absolute value detector and supply an integrated signal. The integrating filter has at least one selectable filter coefficient indicative of the response time of the integrating filter. A control module is configured to select a first value for the selectable filter coefficient so that during a first mode of operation of the squelch circuit the response time of the integrating filter is sufficiently fast to determine the power level of the integrated signal over a predefined time interval relative to respective squelch thresholds. The control module is further configured to select a second value for the selectable filter coefficient so that during a second mode of operation subsequent to the first mode of operation the response time of the integrating filter is sufficiently slow to smooth out power level variations, if any, due to fading of the audio signal.

24 Claims, 4 Drawing Sheets

$$H(z) = \frac{1-a}{1-az^{-1}}$$

DUAL SPEED SQUELCH CIRCUIT AND METHOD

BACKGROUND OF THE INVENTION

The present invention is generally related to signal processing, and, more particularly, to signal processing for controlling squelch in a radio receiver operable to scan at least a priority channel.

In Specialized Mobile Radios (SMRs), also generally known as LMR (Land Mobile Radio, PAMR (Public Access Mobile Radio), PMR (Private Mobile Radio), TMR (Trunked Mobile Radio), and TRS (Trunked Radio System), a squelch circuit is commonly used for automatically muting the audio response of a radio receiver configured to receive frequency modulated (FM) voice signals. That is, preventing annoying noise from being heard when there is no received signal present or the received signal is too weak to be intelligible, and unmuting the audio response when a signal likely to be intelligible is received.

Typical squelch circuits employ a measurement of the energy of a portion of the spectrum of the recovered audio ("out-of-band audio" that starts sufficiently above the highest audio frequency components, generally at about 3 kHz) as a factor in determining whether to mute the recovered voice signal. This is based on the well-known phenomenon that the energy in the out-of-band region decreases in response to a stronger radio signal. Unfortunately, known squelch circuits, when used on the priority channel of a frequency-scanned radio, typically require excessive processing time to determine the presence or absence of a signal. The excessive processing latency creates noticeable gaps in the speaker audio if the priority channel scan happens to interrupt an ongoing signal reception. Also, excessive priority channel squelch processing time can be detrimental if the priority channel is scanned during an ongoing reception of the control channel of a trunked system; in such cases, the processing time should be sufficiently less than the control channel slot time. Many of the earlier solutions rely on single speed techniques that require processing times on the order of 50 milliseconds or more before deciding if a signal is present or absent. During this processing interval, the audio is muted. This processing time would be fast enough if the radio is in a "standby" mode and not scanning. In fact, many conventional voice radio receivers that are not designed for channel scanning employ continuous detection of the energy of the out-of-band audio, often combined with hysteresis techniques, to avoid muting a recovered audio signal during brief periods of weak signal reception caused by fading. The response time of such circuits is typically 50 milliseconds (msec) or more, and they have provided reliable and efficient operation for non-scanning applications. However, such a processing time would be too slow for utilization in the priority channel for frequency-scanned operation for the reasons stated above.

U.S. Pat. No. 6,259,904 describes a technique that purportedly generates a fast squelch through various actions that require generating a noise signal from a demodulated signal, generating a squelch check request of one of two types, performing a release of a reset control in response to the squelch check request, generating an integrated noise signal having essentially no decay rate from the noise signal starting at the release of the reset control, generating a result of a comparison of the integrated noise signal to one of two values corresponding to the one of two types of squelch check requests at an expiration of a predetermined delay started at the release of the reset control, and controlling a muting of a speaker in response to the comparison. Thus, it appears that such technique requires relatively complex logic for implementing the above-described actions. In addition, such technique appears to use various circuit components, such as a resettable noise integrator consisting of a reset switch and logic for resetting a capacitor used for grounding the noise signal. Needless to say, such components add incremental costs and hardware complexity to the squelch circuit described in that patent.

Thus, it would be desirable to provide circuit and techniques, colloquially referred to as "Dual-Speed Squelch" or DSS techniques, that, at relatively low-cost, accurately and reliably provide sufficiently fast processing speed for priority scan operation in a radio terminal. It would be further desirable to minimize noticeable gaps in the speaker audio. A significant improvement over known techniques could be achieved if one could determine that there is no signal present and leave the priority channel in about 25% of the time of earlier squelch algorithms without having to use cumbersome logic or circuitry. It would be further desirable to provide circuit and techniques that enable high probability of detection for worst-case faded signal levels and low probability of falsing on nonexistent signals. It would be further desirable to provide an improved squelch technique that can be readily integrated or retrofitted into existing frequency-scanned radios so that such radios can provide improved performance without affecting the basic design of the radio.

BRIEF SUMMARY OF THE INVENTION

Generally, the present invention fulfills the foregoing needs by providing in one aspect thereof a squelch circuit including an audio-removal filter coupled to receive an audio signal. The passband of the audio-removal filter is selected sufficiently high relative to frequency components of the audio signal. An absolute value detector is coupled to the audio-removal filter to supply an output signal having a positive polarity regardless of the polarity of the signal supplied by the audio-removal filter. An integrating filter is coupled to receive the output signal from the absolute value detector and supply an integrated signal. The integrating filter has at least one selectable filter coefficient indicative of the response time of the integrating filter. A control module is configured to select a first value for the selectable filter coefficient so that during a first mode of operation of the squelch circuit the response time of the integrating filter is sufficiently fast to determine the power level of the integrated signal over a predefined time interval relative to respective squelch thresholds. The control module is further configured to select a second value for the selectable filter coefficient so that during a second mode of operation subsequent to the first mode of operation the response time of the integrating filter is sufficiently slow to smooth out power level variations, if any, due to fading of the audio signal.

The present invention further fulfills the foregoing needs by providing in another aspect thereof, a method for squelch control in a radio receiver. The method allows filtering an audio signal with a bandpass sufficiently high relative to frequency components of the audio signal. The method further allows generating an output signal having a positive polarity regardless of the polarity of the signal obtained through the audio filtering action. The method provides an integrating filter coupled to receive the positive polarity signal and supply an integrated signal. The integrating filter has at least one selectable filter coefficient indicative of the response time of the integrating filter. The method allows selecting a first value for the selectable filter coefficient so that during a first mode of operation the response time of the integrating filter is sufficiently fast to determine the power level of the integrated signal over a predefined time interval relative to respective squelch thresholds; and selecting a second value for the selectable filter coefficient so that during a second mode of operation subsequent to the first mode of operation, the response time of the integrating filter is sufficiently slow to smooth out power level variations, if any, due to fading of the audio signal.

BRIEF DESCRIPTION OF THE DRAWINGS

The features and advantages of the present invention will become apparent from the following detailed description of the invention when read with the accompanying drawings in which.

DETAILED DESCRIPTION OF THE INVENTION

Figures 1, 3:
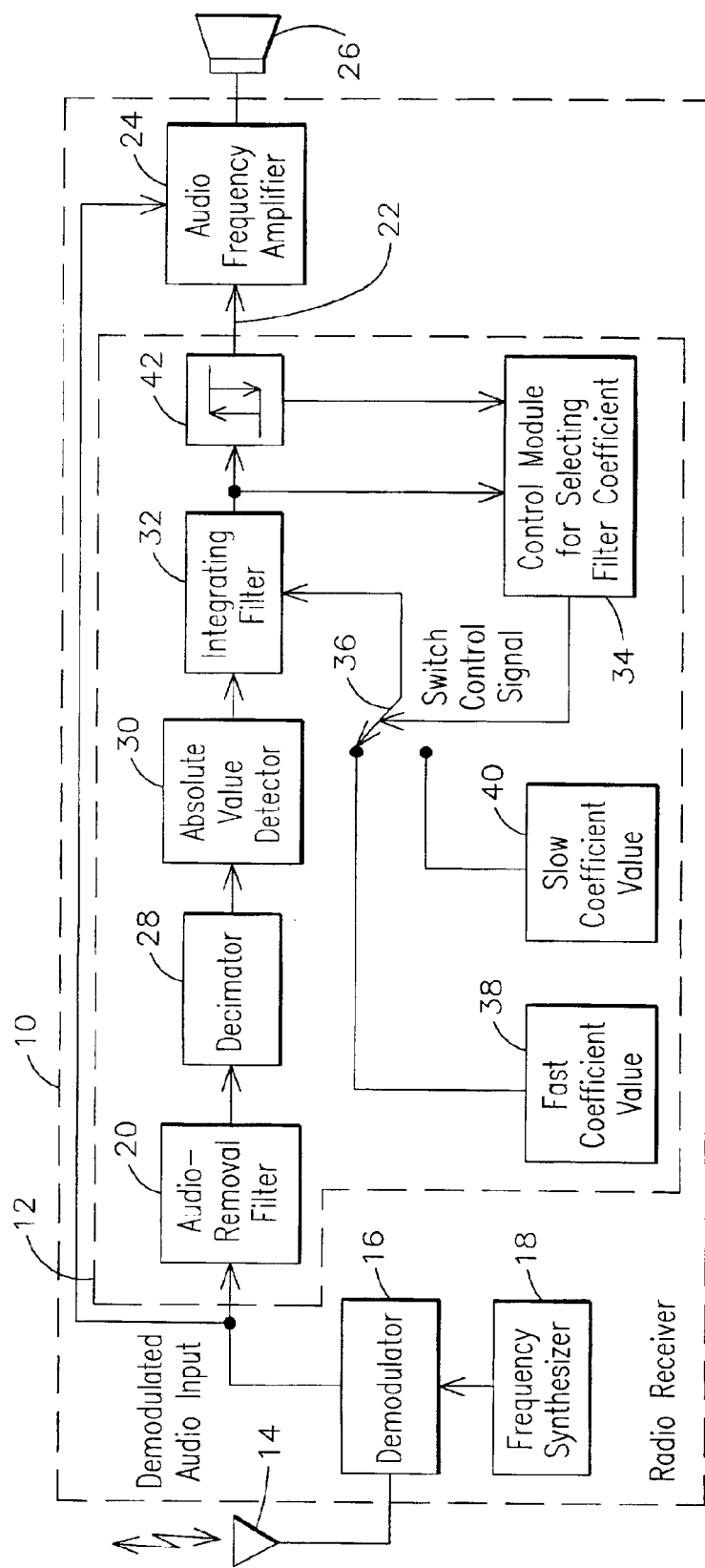
FIG. 1 is a schematic block diagram representation of a basic frequency-scanned radio receiver using a squelch circuit embodying aspects of the present invention.
FIG. 3 illustrates an exemplary transfer function in the z-domain of an integrating digital filter used in the squelch circuit of FIG. 1.

FIG. 1 illustrates a schematic block diagram representation of a basic frequency-scanned radio receiver 10 using a squelch circuit 12 embodying aspects of the present invention. As shown in FIG. 1, radio receiver 10 includes an antenna 14 for receiving radio signals. The radio signal, after suitable amplification and frequency conversion appropriate for a selected channel, is demodulated by a demodulator 16 using techniques well-understood by those skilled in the art. As suggested above, the present invention takes advantage of certain known and predictable characteristics of FM receivers that allow determining whether an intelligible signal is likely to be present or absent in the selected channel. Such a determination is based on an estimate of the noise level outside the audio spectrum. More particularly, in radio receivers using FM detection, the noise level is relatively low if a signal is present. Conversely, the noise level increases if a signal is absent. As is well-known to those skilled in the art, such FM radio receivers may use a frequency synthesizer 18 for achieving "lock on" to the selected channel. Since the principles of operation regarding FM detection and frequency synthesis in radios capable of operating in a scanning mode are well-understood and are only peripheral for purposes of the present invention, the reader will not be burdened with such details.

Figure 8:
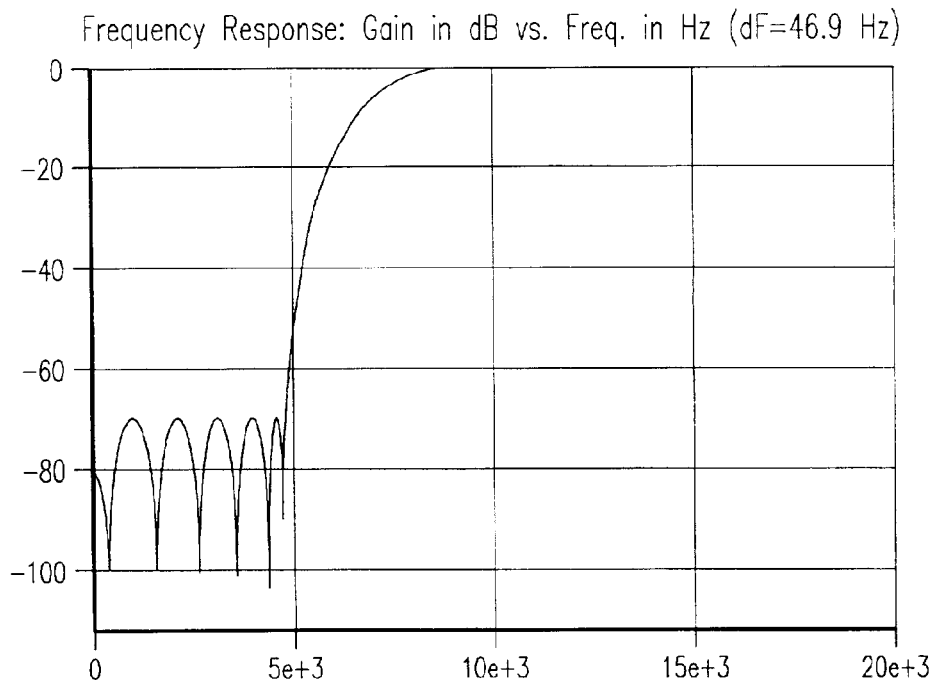
FIG. 8 is an exemplary frequency response of an audio-removal filter used in the squelch circuit of FIG. 1.

As further illustrated in FIG. 1, squelch circuit 12 receives the demodulated audio from demodulator 16 through an audio-removal filter 20, such as a high-pass or band-pass filter. As suggested above, the passband of the audio-removal filter is selected sufficiently high relative to frequency components of the audio signal. An exemplary frequency response of filter 20 is illustrated in FIG. 8. As described in greater detail below, squelch circuit 12 automatically generates a squelch control signal 22 that controls an audio amplifier 24 for selectively actuating a speaker 26 on and off. That is, selectively unmuting and muting the audio response of the speaker. In one exemplary embodiment, the demodulated audio input is generally sampled at a rate of about 48 kHz and a decimator 28 may be optionally provided to slow down such sampling rate, e.g., by discarding every other sample. It will be appreciated that in a squelch implementation that uses software code loaded in a digital signal processor (DSP), the frequency down-conversion provided by the decimator allows to make more efficient use of the processing power of the DSP by saving MIPS, (Millions of Instructions per Second), etc.

An absolute value detector 30 or square law device or equivalent is coupled to the audio-removal filter (through decimator 28) to supply an output signal having a positive polarity regardless of the polarity of the signal supplied by the audio-removal filter. An integrating filter 32, such as a low-pass filter, is coupled to receive the output signal from the absolute value detector and supply an integrated signal. The inventor of the present invention has innovatively recognized that a fast squelch can be advantageously achieved if the integrating filter is configured to have at least one selectable filter coefficient indicative of the response time of the integrating filter.

A control module 34 is configured to select a first value for the selectable filter coefficient so that, during a first mode of operation of the squelch circuit, the response time of the integrating filter is sufficiently fast to determine the power level of the integrated signal over a predefined time interval relative to respective squelch thresholds. In one exemplary embodiment, the predefined time interval lasts about 10 msec. The control module 34 is further configured to select a second value for the selectable filter coefficient so that during a second mode of operation subsequent to the first mode of operation, the response time of the integrating filter is sufficiently slow to smooth out power level variations, if any, due to fading of the audio signal. By way of example, during the first mode of operation, a switch 36 is actuated by control module 34 to select a filter coefficient having a value that results in a relatively fast time response for the integrating filter. This fast filter coefficient may be stored in a memory 38. Conversely, during the second mode of operation, the switch 36 is actuated by control module 34 to select a filter coefficient having a value that results in a relatively slow time response for the integrating filter. The slow filter coefficient may be stored in a memory 40.

Thus, the squelch circuit embodying aspects of the present invention uses a dynamically-switchable integration time to achieve a response time of at least 5–10 msec, which is believed to provide about a factor of four improvement in response time relative to conventional squelch circuits (hereafter called slow squelch (SS)).

In one exemplary embodiment, illustrated in FIG. 3, the integrating filter comprises an IIR (Infinite Impulse Response) digital filter, also known in the art as a recursive filter, with an exemplary z-domain transfer function defined as follows:

$$H(z) = (1-a)/(1-a\,z^{-1})$$

For readers who desire background information regarding linear discrete dynamic system analysis and basic properties of the z-transform and applications thereof to digital filters, reference is made to Chapters 2 and 3 of textbook titled "Digital Control of Dynamic Systems" by G. F. Franklin and J. D. Powell, copyrighted in 1980 by Addison-Wesley publishing Company, Inc., which chapters are herein incorporated by reference. As suggested above, the integrating filter uses a dynamically switchable value for the selectable coefficient (represented by the letter "a") to achieve a fast response for initially determining whether there is a signal on the priority channel and then switching to a filter coefficient value configured to provide a relatively slow response thereafter. In general, the filter coefficient values are selected to be commensurate with the respective response times (e.g., "slow" and "fast") that appropriately meet the requirements of any given application. As will be readily appreciated by those skilled in the art, the filter coefficient values may vary depending on the specific filter architecture and sampling rate. It will be understood, however, that the present invention is not limited either to the filter transfer function illustrated above, or to any specific filter coefficients or timing parameters, since such transfer function, coefficients and parameters are meant to be illustrative of one practical design and are not meant to limit the scope of the present invention. Accordingly, in one exemplary embodiment, the respective values for the selectable filter coefficient "a" may be as follows:

$$a = 0.990 \quad (t_o < t < t_o + t_s + 10 \text{ msec})$$

$$a = .998 \quad \text{elsewhere;}$$

Where $t_O$ represents the time at which the synthesizer is commanded to start scan of the priority channel (e.g., every 0.25 seconds), and $t_S$ represents synthesizer settling time. For example, in typical frequency-scanned radio receivers there exists a predictable "turn-on" delay period before the receiver is able to produce a usable signal because the frequency synthesizer of the receiver generally requires a relatively short period of time to "lock-on" to the selected channel. The duration of this initial turn-on delay (referred above as synthesizer settling time) is usually known or predictable for any given receiver design.

As suggested above, the 0.990 filter coefficient value provides fast squelch response for making an initial determination in about 10 msec and the 0.998 filter coefficient value provides a slower response. The slower filter coefficient provides squelch robustness in the event fading of the received signal occurs, and would avoid premature withdrawal from the priority channel due to a rapid fade in the received signal.

As suggested above, the integrating filter output is first sampled for a time interval lasting about $t_S$+10 msec after the synthesizer switches to the priority channel. During this $t_S$+10 msec time interval, the audio is muted to reduce "popping" during this transient time interval.

As shown in FIG. 1, a hysteresis threshold device 42 is provided so that if, for example, the first sampled value supplied by the integrating filter is less than a lower threshold value, (e.g., 0.36P, indicative of a signal with greater than about 12 dB SINAD, wherein P represents the peak integrating filter output that would occur if a signal is not present) a "signal present" decision is made and the radio will remain on the priority channel. In this case, the audio is unmuted, and the integrating filter output would be sampled at a 24 kHz rate thereafter. That is, the integrating filter would be sampled essentially continuous. The radio terminal will leave the priority channel the first instance thereafter that the integrating filter output exceeds an upper threshold value (e.g., 0.875P, indicative of approximately 8 dB SINAD), which indicates that the priority channel signal has either vanished or is at too low a level to support intelligible audio quality. If the first sample supplied by the integrating filter is greater than 0.875P, the radio terminal would immediately leave the priority channel. This ensures that the squelch will normally spend no more than about 10 msec in determining that there is no signal and requesting release of the priority channel to minimize gaps and annoying transients in the audio.

Based on the foregoing equations, it will be appreciated that the filter coefficient would be essentially instantaneously switched from "fast" to "slow" if the decision is made to stay on the priority channel. In one exemplary embodiment, the 0.990 filter coefficient provides a sufficiently fast integration time to force the integrating filter to provide an output that enables rendering a quick decision on whether to remain on or leave the priority channel. In this exemplary embodiment, the 0.998 filter coefficient would provide a slower time response to better "smooth" momentary fading events and prevent premature exit from the priority channel due to such momentary fading events.

Figure 2:
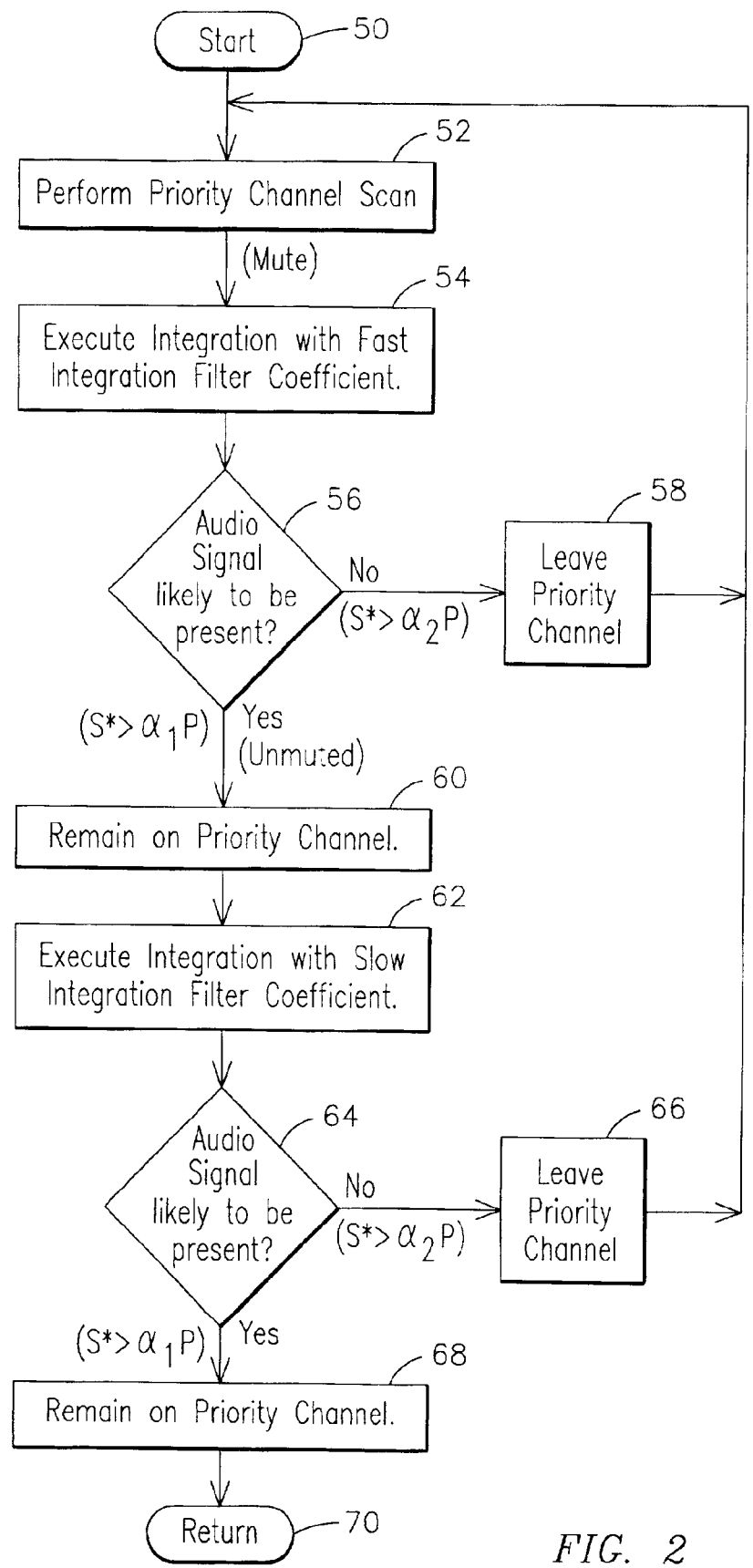
FIG. 2 is a flow diagram illustrating exemplary steps or actions that may occur during operation of the squelch circuit of FIG. 1.

FIG. 2 is a flow diagram illustrating exemplary steps or actions that may occur during operation of a squelch circuit embodying aspects of the present invention. Subsequent to start step 50, step 50 allows performing a priority channel scan. As suggested above, at this point the squelch control signal is set to mute the audio response. Step 54 allows executing integration using the fast filter coefficient. Step 56 allows making an initial determination generally within about 10 msec as to whether an intelligible audio signal is likely to be present. In the event the sampled output (S*) from the integrating filter exceeds an upper threshold value, ($\alpha_2 P$) then the receiver would immediately leave the priority channel, as indicated at block 58. However, as indicated at block 60, in the event the sampled output (S*) from the integrating filter is below a lower threshold value, ($\alpha_1 P$) then the receiver would remain on the priority channel, and the squelch control signal would be set to unmute the audio response.

In the most general sense, as will be appreciated by those skilled in the art, the exemplary actions that lead to the unmuting action described in the previous sentence represent one exemplary embodiment for controlling the squelch circuit. One alternative embodiment would be to keep the channel muted until some fixed time later (say, 50 msec after the slow integration constant is switched in), and then check the threshold again, whereupon a decision would be made as to whether to unmute the channel. At this point, the value of the selectable filter coefficient would be switched to execute integration with a relatively slower time response. Prior to return step 68, the integrating filter would be sampled at the sampling frequency (e.g., 24 Khz), and blocks 64, 66 and 68 would allow for determining whether to continue or exit the priority channel by comparing the sampled value supplied by the integrating filter relative to the respective hysteresis threshold values as discussed in the context of blocks 56, 58 and 60.

Figure 4:
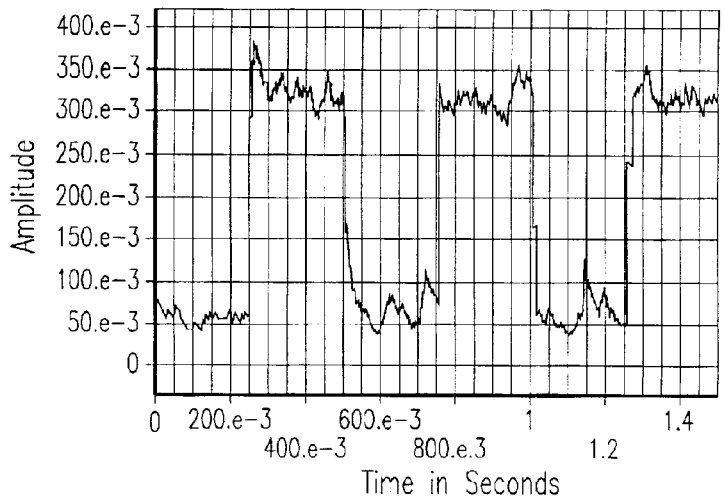
FIGS. 4–6 show respective plots of a test signal processed by respective integrating filters corresponding to a) Dual Speed Squelch (DSS) embodying aspects of the present invention; b) Fast Squelch (FS); and c) Slow Squelch that comparatively allow to visually grasp that the DSS processing technique that embodies aspects of the present invention achieves the best attributes of both the slow and fast squelch techniques.
Figure 5:
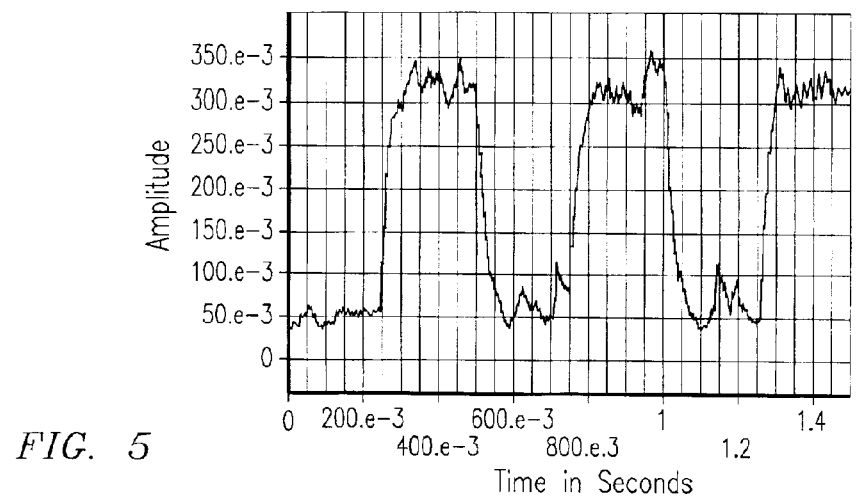
Figure 6:
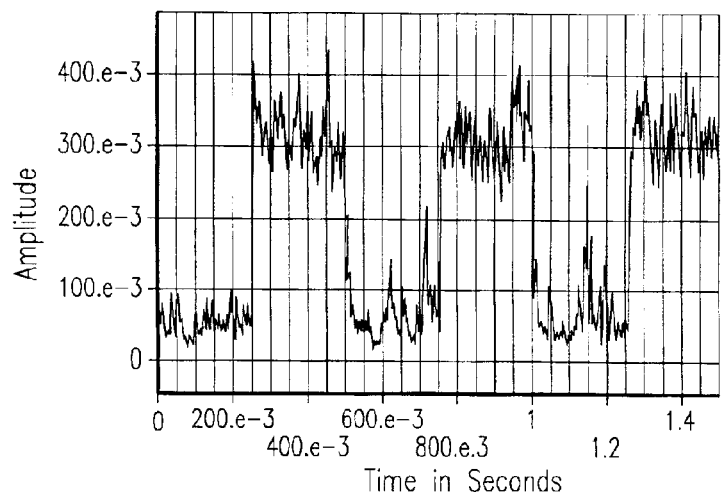

FIGS. 4–6 show respective plots of a faded test signal processed by the integrating filter with a level of −110 dBm and with a 50% on/off duty factor. The dual speed squelch (DSS) for plot illustrated in FIG. 4 is assumed to switch in the fast time constant for 10 msec after each transition from "off to on" or "on to off" and then the slow time constant at all other times. The plots of FIGS. 5 and 6 respectively represent an exemplary slow squelch (SS) and a fast squelch (FS) and use a single coefficient value, slow and fast respectively. As can be seen by comparing the plot of FIG. 5 versus the plots of FIGS. 4 and 6, the response time at the transition points where the signal appears and disappears is noticeably longer for the slow squelch (SS) than for the other two situations, however, the SS appropriately smoothes fluctuations. By way of comparison, the FS (FIG. 6) has a much improved response time. However, in the FS there are substantial fluctuations of level when the signal is present, which, if high enough, will cause the squelch to declare that the signal has left and leave the priority channel even though a signal is still present. Thus, it will be appreciated from the plots of FIGS. 4–6 that the dual speed DSS squelch embodying aspects of the present invention achieves the best attributes of both the slow and fast techniques.

Figure 7:
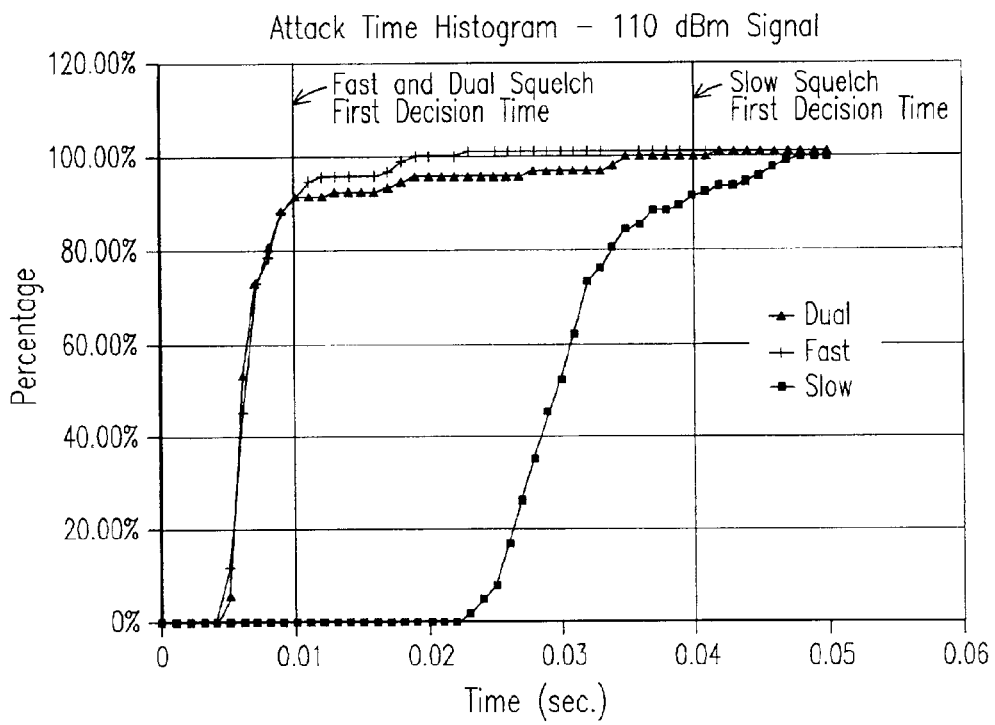
FIG. 7 is an exemplary cumulative histogram of the time that it takes the integrating filter output under various squelch techniques (DSS, SS or FS) to make a determination of "signal-present".

FIG. 7 shows an exemplary cumulative histogram of the time that it takes the integrating filter output for three types of squelches (DSS, SS or FS) to fall below the lower "signal-present" threshold for a signal level of −110 dBm, assuming that the initial state of the squelch is the worst case value (>0.875P, "closed"). The median response time for the fast-only and dual-speed squelch is about 5 msec, but is about 30 msec for the slow squelch. The indicated times at which the "first decision" occurs after synthesizer settling for the fast, dual, and slow squelches were established to balance response time versus probability of detection. The speed difference of the slow squelch versus the other two situations is readily apparent.

Brief Discussion Regarding Initial State of the Squelch at Channel Switchover

As will be appreciated by those skilled in the art, performance (i.e., probability of detection, probability of falsing, response times) for any particular transition to the priority channel will be influenced by the state of the squelch when it first enters the priority channel. The state of the squelch at any point in time is partially, but not entirely, defined by the particular value in its integrating filter memory when it begins to process new channel data. Due to the hysteresis in the squelch threshold, the initial value in the integrating filter memory does not necessarily define whether the initial squelch state is open or closed. As such, the state of the squelch may be defined a two-element vector (filter_output_value; and open/close_status). There are several possibilities for the initial squelch state at the channel switchover point:

1. If the squelch is continuously free-running for both the non-priority and priority channels, it could be the state from the channel that immediately precedes the switchover.
2. Use the final state from the last sampling of that particular channel. For example, for the priority channel, this would be the the final state of the squelch the last time that channel was visited (nominally 0.25 seconds ago).
3. A fixed value. For example, to optimize response time for detecting that there is no signal present, the initial lowpass filter value could be forced to, say, P, and the initial open/close status would be "closed".

For best stability and response time to both signal present and signal absent, technique 2 above has been shown particularly useful. However, none of the two techniques is precluded since such techniques could be used depending of the requirements of any given application.

The present invention can be embodied in the form of computer-implemented processes and apparatus for practicing those processes. The present invention can also be embodied in the form of computer program code containing computer-readable instructions embodied in tangible media, such as floppy diskettes, CD-ROMs, hard drives, flash memories, EEPROM, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose computer, the computer program code segments configure the computer to create specific logic circuits or processing modules.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A squelch circuit comprising:

an audio-removal filter coupled to receive an audio signal, the passband of the audio-removal filter being selected sufficiently high relative to frequency components of the audio signal;

an absolute value detector coupled to the audio-removal filter to supply an output signal having a positive polarity regardless of the polarity of the signal supplied by the audio-removal filter;

an integrating digital filter coupled to receive the output signal from the absolute value detector and supply a first integrated signal during a first mode of operation of the squelch circuit, and a second integrated signal during a second mode of operation of the squelch circuit, the integrating filter responsive to at least one selectable filter coefficient for selectively changing an integration response time of the integrating filter; and a control module configured to select a first numerical value for the selectable filter coefficient so that during the first mode of operation of the squelch circuit a first integration response time of the integrating filter is sufficiently fast to determine the power level of the first integrated signal over a predefined time interval relative to respective squelch thresholds, the control module further configured to select a second numerical value for the selectable filter coefficient so that during the second mode of operation subsequent to the first mode of operation a second integration response time of the integrating filter is sufficiently slow relative to the first integration response time of the integrating filter to smooth out power level variations, if any, in the second integrated signal.

2. The squelch circuit of claim 1 wherein the integrating filter comprises a recursive filter having a Z-domain transfer function defined by the following equation, $$H(z) = \frac{1-a}{1-az^{-1}},$$

wherein a is the selectable filter coefficient.

3. A radio receiver configured to operate in a scanning mode including scanning of a priority channel, said radio comprising the squelch circuit of claim 1.

4. The radio receiver of claim 3 wherein, when the radio receiver is commanded to start scan of the priority channel, the value of the filter coefficient is selected to provide a relatively fast integration time.

5. The radio receiver of claim 3 wherein, when the radio receiver is commanded to start scan of the priority channel, the value of the filter coefficient is selected to a value appropriate for performing a relatively fast squelch determination over the predefined time interval.

6. The radio receiver of claim 3 wherein the respective squelch thresholds comprise a first squelch threshold value for determining the presence of an audio signal likely to be intelligible upon comparison with the integrated signal supplied by the integrating filter, and a second squelch threshold value for determining absence of the audio signal upon comparison with the integrated signal supplied by the integrating filter, and wherein the value of the first threshold value is lower relative to the second threshold value.

7. The radio receiver of claim 6 wherein, when the power level of the integrated signal is below the first threshold value upon completion of the predefined time interval, the radio receiver remains on the priority channel, and the value of the filter coefficient is switched to provide a relatively slow integration time.

8. The radio receiver of claim 7 wherein, when the power level of the integrated signal exceeds the second threshold value upon completion of the predefined time interval, the radio receiver leaves the priority channel until a new priority channel scan is performed.

9. A method for squelch control in a radio receiver, the method comprising:
 filtering an audio signal with a bandpass sufficiently high relative to frequency components of the audio signal;
 generating an output signal having a positive polarity regardless of the polarity of the signal obtained through the audio filtering action;
 providing a digital integrating filter coupled to receive the positive polarity signal and supply a first integrated signal during a first mode of operation of the squelch circuit, and a second integrated signal during a second mode of operation of the squelch circuit, the integrating filter responsive to at least one selectable filter coefficient for selectively changing an integration response time of the integrating filter;
 selecting a first numerical value for the selectable filter coefficient so that during the first mode of operation a first integration response time of the integrating filter is sufficiently fast to determine the power level of the first integrated signal over a predefined time interval relative to respective squelch thresholds; and
 selecting a second numerical value for the selectable filter coefficient so that during the second mode of operation subsequent to the first mode of operation, a second integration response time of the integrating filter is sufficiently slow to smooth out power level variations, if any, in the second integrated signal.

10. The squelch control method of claim 9 wherein the integrating filter comprises a recursive filter having a Z-domain transfer function defined by the following equation, $$H(z) = \frac{1-a}{1-az^{-1}},$$

wherein a is the selectable filter coefficient.

11. The squelch control method of claim 9 wherein the radio receiver is operable in a scanning mode including scanning of a priority channel.

12. The squelch control method of claim 11 wherein, when the radio receiver is commanded to start scan of the priority channel, the value of the filter coefficient is selected to provide a relatively fast integration time.

13. The squelch control method of claim 11 wherein, when the radio receiver is commanded to start scan of the priority channel, the value of the filter coefficient is selected a value appropriate for performing a fast squelch determination over the predefined time interval.

14. The squelch control method of claim 11 wherein the respective squelch thresholds comprise a first squelch threshold value for determining the presence of an audio signal likely to be intelligible upon comparison with the integrated signal supplied by the integrating filter, and a second squelch threshold value for determining absence of the audio signal upon comparison with the integrated signal supplied by the integrating filter, and wherein the value of the first threshold value is lower relative to the second threshold value.

15. The squelch control method of claim 14 wherein, when the power level of the integrated signal is below the first threshold value upon completion of the predefined time interval, the radio receiver remains on the priority channel, and the value of the filter coefficient is switched to provide a relatively slow integration time.

16. The squelch control method of claim 15 wherein, when the power level of the integrated signal exceeds the second threshold value upon completion of the predefined time interval, the radio receiver leaves the priority channel until a new priority channel scan is performed.

17. A computer-readable medium including instructions causing a computer to control squelch in a radio receiver by:
 filtering an audio signal with a bandpass sufficiently high relative to frequency components of the audio signal;
 generating an output signal having a positive polarity regardless of the polarity of the signal obtained through the audio filtering action;
 configuring a digital integrating filter to receive the positive polarity signal and supply a first integrated signal during a first mode of operation of the squelch circuit, and a second integrated signal during a second mode of operation of the squelch circuit, the integrating filter responsive to at least one selectable filter coefficient for selectively changing an integration response time of the integrating filter;
 selecting a first numerical value for the selectable filter coefficient so that during the first mode of operation a first integration response time of the integrating filter is sufficiently fast to determine the power level of the first integrated signal over a predefined time interval relative to respective squelch thresholds; and
 selecting a second numerical value for the selectable filter coefficient so that during the second mode of operation subsequent to the first mode of operation, a second integration response time of the integrating filter is sufficiently slow to smooth out power level variations, if any, in the second integrated signal.

18. The computer-readable medium of claim 17 wherein the integrating filter comprises a recursive filter having a Z-domain transfer function defined by the following equation, $$H(z) = \frac{1-a}{1-az^{-1}},$$

wherein a is the selectable filter coefficient.

19. The computer-readable medium of claim 17 wherein the radio receiver is operable in a scanning mode including scanning of a priority channel.

20. The computer-readable medium of claim 19 wherein, when the radio receiver is commanded to start scan of the priority channel, the value of the filter coefficient is selected to provide a relatively fast integration time.

21. The computer-readable medium of claim 19 wherein, when the radio receiver is commanded to start scan of the priority channel, the value of the filter coefficient is selected to about 0.990 and the value of the predefined time interval is about 10 msec.

22. The computer-readable medium of claim 19 wherein the respective squelch thresholds comprise a first squelch threshold value for determining the presence of an audio signal likely to be intelligible upon comparison with the integrated signal supplied by the integrating filter, and a second squelch threshold value for determining absence of the audio signal upon comparison with the integrated signal supplied by the integrating filter, and wherein the value of the first threshold value is lower relative to the second threshold value.

23. The computer-readable medium of claim 22 wherein, when the power level of the integrated signal is below the first threshold value upon completion of the predefined time interval, the radio receiver remains on the priority channel, and the value of the filter coefficient is switched to provide a relatively slow integration time.

24. The computer-readable medium of claim 23 wherein, when the power level of the integrated signal exceeds the second threshold value upon completion of the predefined time interval, the radio receiver leaves the priority channel until a new priority channel scan is performed.

* * * * *